United States Patent [19]

Takeuchi et al.

[11] Patent Number: 4,745,578

[45] Date of Patent: May 17, 1988

[54] MAGNETIC BUBBLE MEMORY DEVICE

[75] Inventors: Teruaki Takeuchi, Kokubunji; Naoki Kodama, Tachikawa; Masatoshi Takeshita, Hachioji; Takashi Toyooka, Sayama; Ryo Suzuki, Hachioji, all of Japan

[73] Assignee: Hitachi, Ltd., Tokyo, Japan

[21] Appl. No.: 898,517

[22] Filed: Aug. 21, 1986

[30] Foreign Application Priority Data

Sep. 20, 1985 [JP] Japan .................. 60-206445

[51] Int. Cl.⁴ ............................ G11C 19/08
[52] U.S. Cl. ............................ 365/36
[58] Field of Search .......................... 365/36

[56] References Cited

U.S. PATENT DOCUMENTS 4,453,232 6/1984 Koel et al. .................. 365/36

FOREIGN PATENT DOCUMENTS 0006481 9/1980 European Pat. Off. .......... 365/36
0040791 3/1982 Japan ........................ 365/36
0125289 7/1983 Japan ........................ 365/36

Primary Examiner—James W. Moffitt
Attorney, Agent, or Firm—Antonelli, Terry & Wands

[57] ABSTRACT

A magnetic bubble memory device comprises contiguous-disk ion-implanted magnetic bubble propagation tracks formed by implanting selectively ions in a magnetic layer which can hold magnetic bubbles. At least one of the disks which form the ion-implanted bubble tracks and each of which may have a circular or square shape, is configured to include a combination of arcs of circles having different curvatures or a combination of sides of squares having different sizes.

6 Claims, 8 Drawing Sheets

MAGNETIC BUBBLE MEMORY DEVICE

BACKGROUND OF THE INVENTION

This invention relates to a magnetic bubble memory device and in particular to a hybrid type magnetic bubble memory device using both ion-implanted propagation tracks and permalloy propagation tracks, in which the ion-implanted propagation tracks are suitable for reducing the size of the device.

A device storing binary information by using magnetic bubbles or magnetic domains in a magnetic thin film (for example, made of magnetic garnet) whose axis of easy magnetization is perpendicular to the film surface attracts attention. In particular, an ion-implanted magnetic bubble memory device disclosed in U.S. Pat. No. 3,828,329 has an advantage that the operation characteristics are excellent even if the period of bubble propagation tracks is made small.

However, when function portions of the magnetic bubble memory device are formed by using ion-implanted propagation tracks instead of permalloy devices, the characteristics of some portions are not good. The characteristics of generators and detectors formed by ion-implanted propagation tracks are relatively good, but the characteristics of replicate gates and swap gates formed by ion-implanted propagation tracks are very bad.

Therefore, a hybrid type magnetic bubble memory device in which minor loops using ion-implanted propagation tracks are combined with permalloy propagation tracks has been proposed (JP-A-57-40791). In this device, the characteristics of a function portion using permalloy propagation tracks are improved by making the period of the permalloy propagation track 3–6 times as great as that of the ion-implanted propagation tracks in the minor loop.

Further, it has been also proposed to make the storage density in the minor loop portion higher by constructing the minor loop portion with ion-implanted propagation tracks which are several times folded, as shown in FIG. 1, because the period of the permalloy propagation tracks is greater than that of the ion-implanted propagation tracks. In the construction shown in FIG. 1, each of minor loops 1 is connected with read and write major lines 2 and 3 through replicate and swap gates 4 and 5 which are made of permalloy patterns. In FIG. 1, reference numeral 6 represents a bubble generator and numeral 7 represents a bubble detector.

A concrete structure of a minor loop in the hybrid type bubble memory device is shown in FIG. 2. Areas indicated by oblique lines in the figure represent ion-implanted regions. As shown in the figure, a central portion of the minor loop is formed by an ion-implanted propagation track 10 while upper and lower end portions thereof (at the neighborhood of the corners) are formed by permalloy propagation tracks 11. In order to prevent the decrease in a bubble drive force at the boundary of each junction 12 between the ion-implanted propagation track 10 and the permalloy propagation tracks 11, bubbles are transferred at the junction 12 by a combined bubble drive force of both the ion-implanted pattern and the permalloy pattern. For that purpose, it is necessary that a position at which an attracting magnetic pole exists due to the ion-implanted pattern and a position at which an attracting magnetic pole exists due to the permalloy pattern coincide with each other for the arbitrary phase of a rotating field. Therefore, as shown in FIG. 2, the ion-implanted pattern 13 and the permalloy pattern 14 are superposed on each other. In this case, since the period of this permalloy pattern is 3–6 times as great as that of the ion-implanted propagation track at the central portion of the minor loop, as mentioned above, the period of the ion-implanted propagation track 10 at the junction 12 is also 3–6 times as great as that of the ion-implanted propagation track 10 at the central portion of the minor loop.

In the past, such two ion-implanted propagation tracks 10 having remarkably different periods were connected so that recessed portions seen from the non ion-implanted region, i.e. so-called cusps may coincide with each other, as shown in FIG. 3a. However, in the structure shown in FIG. 3a, the operation margin of the whole propagation tracks is narrow, as shown in FIG. 4c. Therefore, this structure is not put into practical use. FIG. 4a shows a relation between the rotating field and the bias field for ion-implanted propagation tracks consisting of a disk pattern having a period of 3 μm, and FIG. 4b, a relation between the rotating field and the bias field for ion-implanted propagation tracks consisting of a disk pattern having a period of 10 μm.

The reason why the operation margin of the whole device with the structure indicated in FIG. 3a is narrow is because when bubbles are propagated from the disk pattern having a greater period to the disk pattern having a smaller period, there takes place a phenomenon in which bubbles propagated to the smaller-period disk pattern are pulled apart therefrom by strong magnetic poles of the greater-period disk pattern. This phenomenon appears remarkably when the phase of the rotating magnetic field is in a direction indicated by arrows in FIG. 3a. When the rotating field is at the phase indicated in FIG. 3a, properly the bubble should be at a position indicated by 50 in the figure. However, when the phase of the rotating field is at such a phase, (+) poles attracting a bubble as indicated in the figure are produced in the disk pattern having the greater period. Then, in the disk pattern having the greater period, the large amount of these attractive poles due to its large period gives rise to an erroneous operation by which a bubble, which is attracted by the disk pattern having the smaller period and is at a position indicated by 50, is pulled apart therefrom and jumps to a position indicated by 51. The situation described above is identical for the case, where the shape of the ion-implanted propagation track at the boundary of an ionimplanted region is not of disk type but of square type, as shown in FIG. 3b.

In order to prevent such an erroneous operation, a structure has been proposed in which the period of the ion-implanted propagation track is gradually increased with an increased distance from the central portion of the minor loop toward the junction 12 between connecting the ion-implanted propagation track portion having the greater period and the ion-implanted propagation track portion having the smaller period, as shown at an area 15 in FIG. 2. As clearly seen in FIG. 2, in the device having such a structure, the central portion of a minor loop has a higher bit density since three contiguous disk patterns are provided by folding the minor loop. However, it is not possible to fold the minor loop at a portion 15 thereof where the period is gradually increased. This is because the period of the minor loop at such a portion 15 is greater than that of the central portion. Consequently, the bit density of the minor loop portion 15 in a direction perpendicular to the bubble propagation direction is one third of that of the central portion of the minor loop. Also in the bubble propagation direction, the bit density of the minor loop portion 15 is smaller than that of the central portion of the minor loop.

Nowadays, the storage density in the magnetic bubble memory device becomes rapidly higher. However, there was a problem that the portion where the period is increased is a useless area in a chip, thereby preventing realization of a high storage density of the device.

SUMMARY OF THE INVENTION

An object of this invention is to provide a hybrid type magnetic bubble memory device with a small device area by reducing a useless area in a region from the junction between the ion-implanted propagation track and the permalloy propagation track to a portion where the period of the minor loop is constant.

The reason why in the prior art hybrid type device a large area is necessary in the region from the junction between the ion-implanted propagation track and the permalloy propagation track to the portion where the period of the minor loop is constant, is because two different patterns in such a region are connected so that recessed portions seen from the non ion-implanted region, i.e. so-called cusps may coincide with each other, which means that it is not possible to change rapidly the size of the two different patterns. In order to remove this inconvenience, according to this invention, the patterns having different periods are so arranged that projecting portions seen from the non ion-implanted region, i.e. so-called tips coincide with each other.

The essential feature of this invention lies in that in a magnetic bubble memory device comprising contiguous-disk ion-implanted magnetic bubble propagation tracks formed by implanting selectively ions in a magnetic layer which can hold magnetic bubbles therein, at least one of the disks which form the ion-implanted bubble propagation tracks and each of which may be circular or square is configured to a combination of arcs of circles having different curvatures or sides of squares having different sizes.

DESCRIPTION OF THE PREFERRED EMBODIMENTS

An embodiment of this invention will now be explained referring to FIG. 5a. This figure illustrates a connection between a contiguous disk type bubble propagation track pattern having a period of 10 $\mu$m and a contiguous disk type bubble propagation track pattern having a period of 3 $\mu$m. In a portion where these two tracks are connected, a half 20 of the pattern unit of the contiguous disk type pattern having the period of 10 $\mu$m and a half 21 of the pattern unit of the contiguous disk type pattern having the period of 3 $\mu$m are contiguous to each other in such a manner that the ends of those halves 20 and 21 or the tips of the imaginary pattern units including the halves 20 and 21 respectively coincide with each other.

Figure 1:
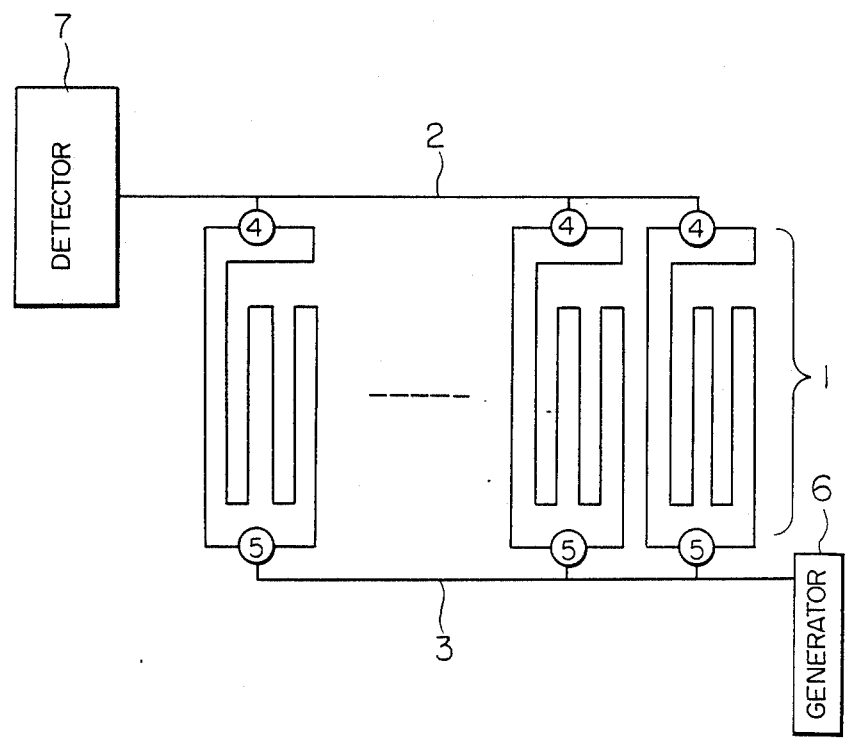
FIG. 1 is a view illustrating the structure of a magnetic bubble memory device of major line/minor loop structure having folded minor loops.
Figure 2:
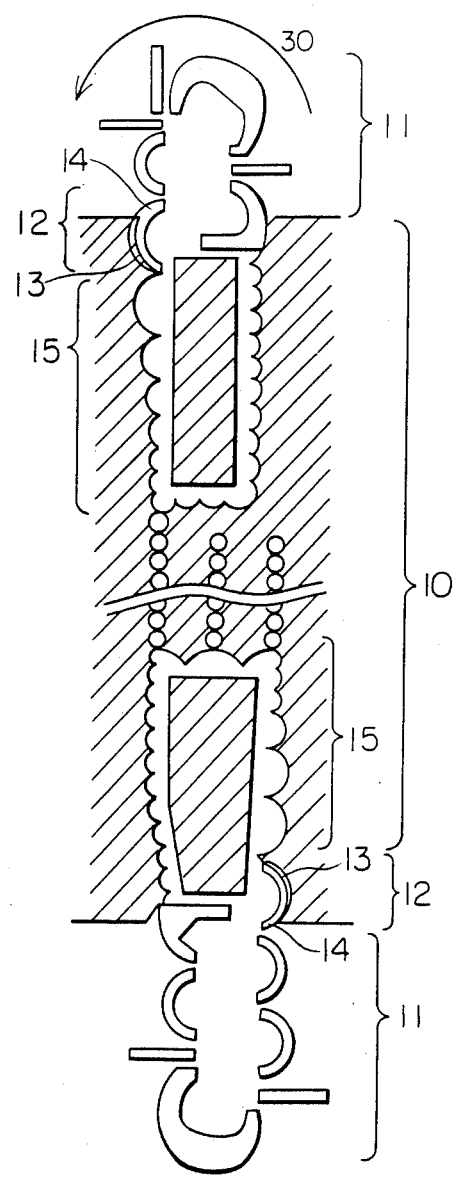
FIG. 2 is a view illustrating a prior art hybrid type minor loop having a portion where the period is gradually increased.
Figure 3:
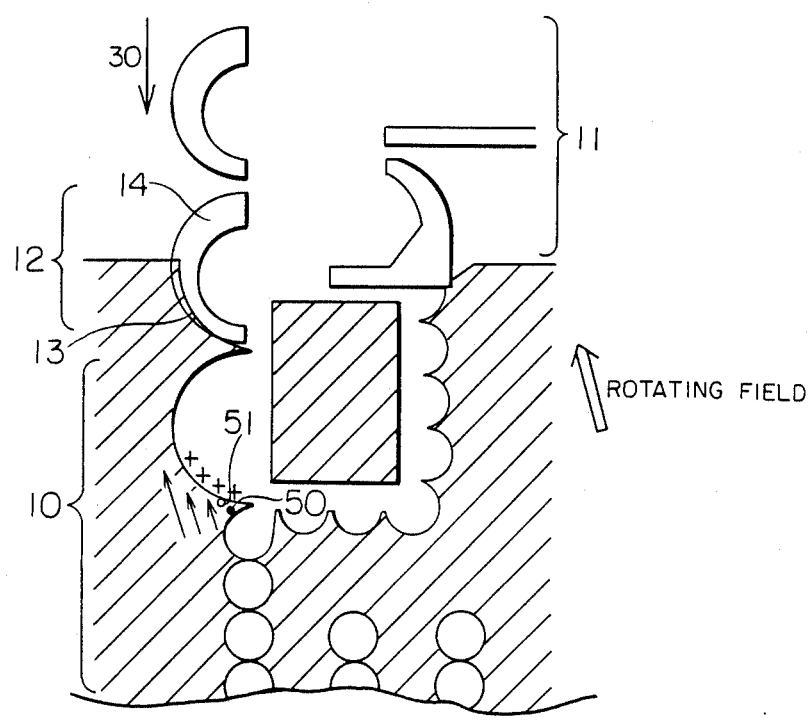
FIGS. 3a and 3b are views illustrating two prior art hybrid type minor loops at the neighborhood of a portion where the period is increased.
Figure 3:
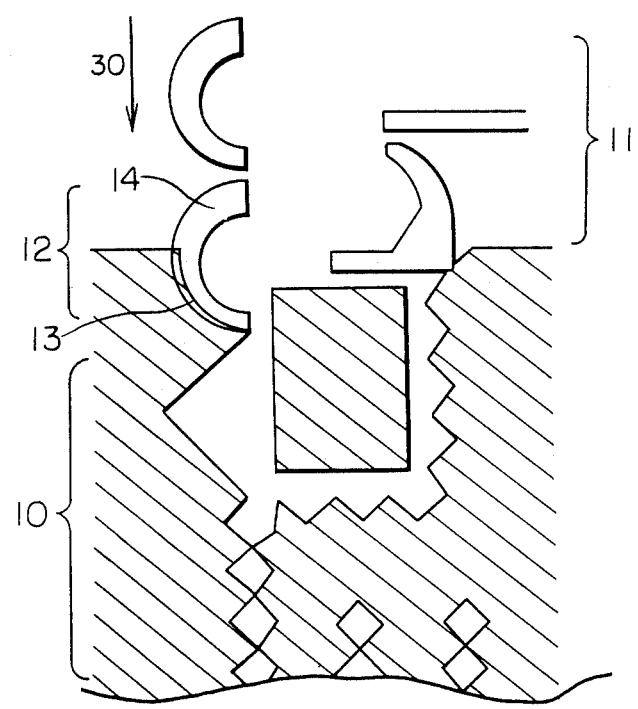
Figure 4A:
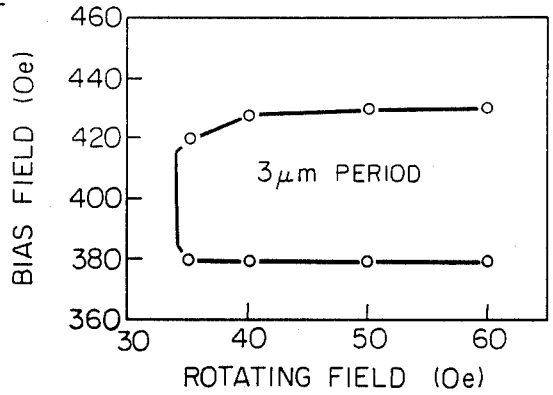
FIGS. 4a to 4c are diagrams showing the operation margins for different parts in the case where a contiguous disk portion having a greater period is jointed with a contiguous disk portion having a smaller period at a cusp.
Figure 4B:
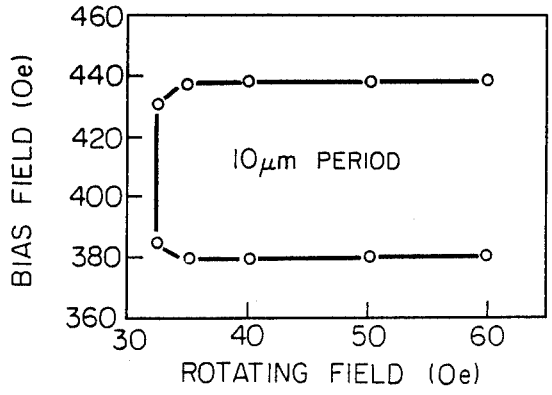
Figure 4C:
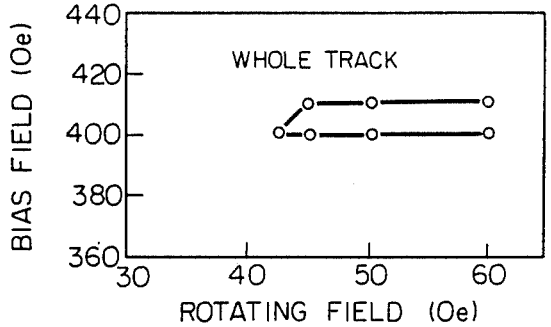
Figure 5:
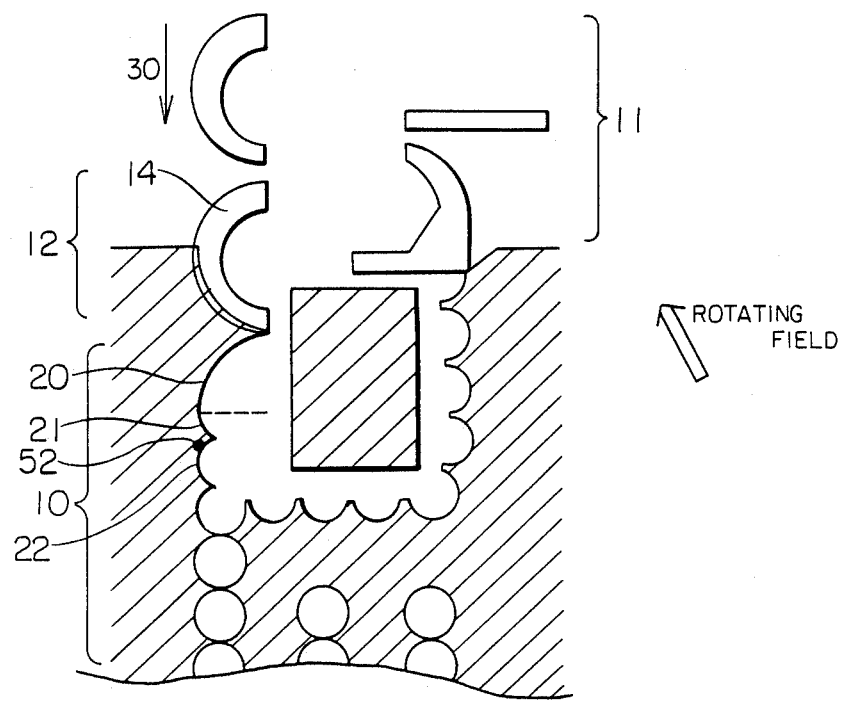
FIGS. 5a and 5b are views illustrating partly two hybrid type minor loops according to this invention, including portions where a contiguous disk portion having a greater period is jointed with a contiguous disk portion having a smaller period at a tip.
Figure 5:
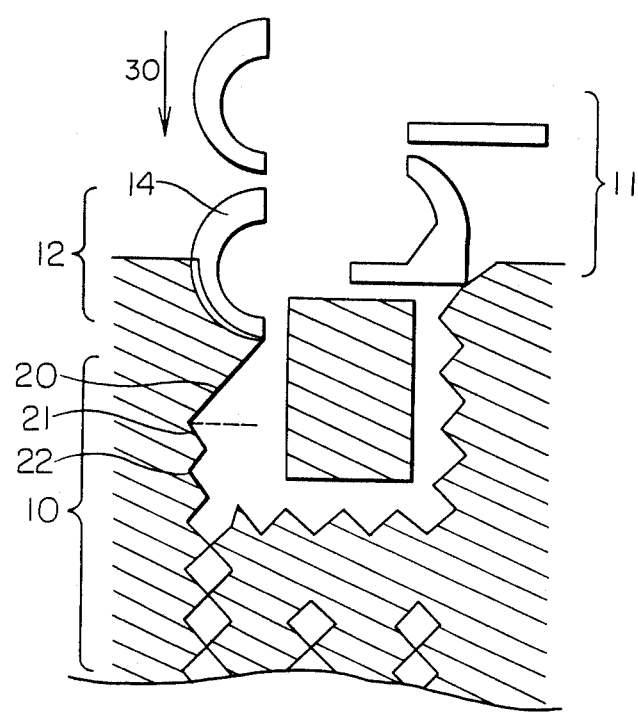

In FIG. 5a, when the rotating field is oriented to a direction indicated in the figure, a bubble on the pattern 22 having the period of 3 $\mu$m adjacent to the pattern portion 21 is at a position indicated by 52. The period of the pattern portion 21 adjacent to the pattern 22 is approximately equal to the period of the pattern 22. Therefore, contrary to the case of the prior art structure shown in FIG. 3a, the attractive magnetic pole produced in the pattern portion 21 is fairly small so that the bubble at the position 52 in FIG. 5a is not pulled apart from the pattern 22. Therefore, no error is produced.

FIG. 5b shows another embodiment to this invention which has the same structure as that shown in FIG. 5a, except that the boundary of the ion-implanted region for the bubble propagation track is square-shaped. The object of this invention can be achieved also by the structure indicated in FIG. 5b. The operation characteristic of the magnetic bubble memory device of the present embodiment at a junction portion between two contiguous disk patterns having different periods is identical to that of the device of the embodiment shown in FIG. 5a.

Figure 6A:
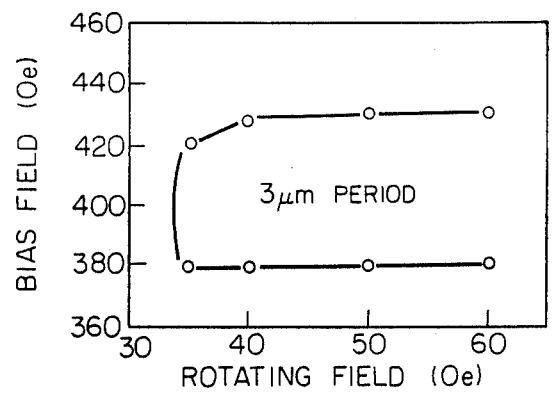
FIGS. 6a to 6c are diagrams showing the operation margins for different different parts of a minor loop according to this invention.
Figure 6B:
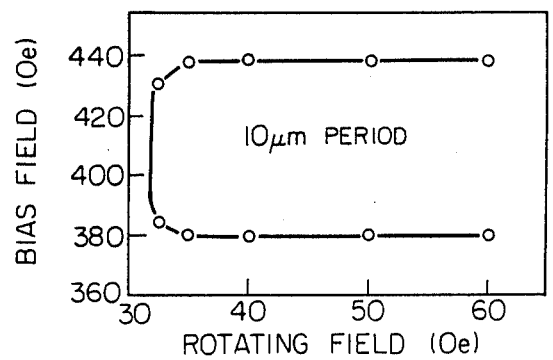
Figure 6C:
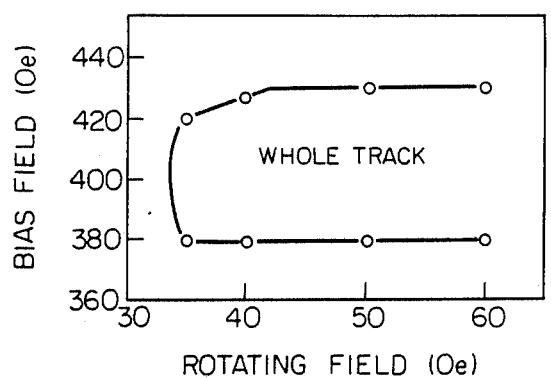

FIGS. 6a to 6c show the operation margins for different parts of the ion-implanted bubble propagation track having the structure of FIG. 5a. More particularly, FIG. 6a shows the operation margin for the 3 $\mu$m-period patterns 21 and 22, FIG. 6b the operation margin for the 10 $\mu$m period pattern 20, and FIG. 6c the common operation margin for the patterns 20, 21 and 22. As apparent from the comparison of FIG. 6c with FIGS. 6a and 6c, the operation margin of the propagation path shown in FIG. 5a is approximately in agreement with the part which is common to the operation margin of the propagation track having the period of 10 $\mu$m and that having the period of 3 $\mu$m. That is, the operation margin decreases scarecely due to such a connection as shown in FIG. 5a.

According to this invention, an effect to reduce the size of the device can be obtained, because it is possible to reduce the area from a junction portion between the ion-implanted bubble propagation track and the permalloy bubble propagation track to a portion where the period is constant. For example, in the case where the period at the central portion of the minor loop is about 3 $\mu$m, the area of a magnetic bubble memory chip according to this invention can be reduced by about 10% with respect to that of a prior art one having a same memory storage. The reduction in area of a chip results in the reduction in size of a package of the magnetic bubble memory, thereby providing an advantage of reducing an electric power required for a rotating field generating coil.

We claim:

1. A magnetic bubble memory device comprising:

minor loop means for storing information therein and including ion-implanted magnetic bubble propagation track means formed by implanting selectively ions in a magnetic layer which can hold magnetic bubbles therein, said track means including a first bubble propagation pattern having a small period and a second bubble propagation pattern having a great period, said first and second bubble propagation patterns being connected in a straight propagation track of said track means so that a tip of the pattern unit of said first bubble propagation pattern is contiguous to a tip of the pattern unit of said second bubble propagation pattern;

major line means or major loop means for reading and writing information; and connecting means between said minor loop means and said major line means or said major loop means.

2. a magnetic bubble memory device according to claim 1, wherein each of said first and second bubble propagation patterns is disk-shaped.

3. A magnetic bubble memory device according to claim 1, wherein each of said first and second bubble propagation patterns is square-shaped.

4. A magnetic bubble memory device comprising;

a major line means or major loop means made of permalloy; and minor loop means each including a magnetic bubble propagation pattern made of permalloy and an ion-implanted magnetic bubble propagation track which has a first bubble propagation pattern having a small period and a second bubble propagation pattern having a great period, said first and second bubble propagation patterns being connected in a straight propagation track of said ion-implanted magnetic bubble propagation track so that a tip of the pattern unit of said first bubble propagation pattern is contiguous to a tip of the pattern unit of said second bubble propagation pattern.

5. A magnetic bubble memory device according to claim 4, wherein each of said first and second bubble propagation patterns is disk-shaped.

6. A magnetic bubble memory device according to claim 4, wherein each of said first and second bubble propagation patterns is square-shaped.

* * * * *